United States Patent [19]

Suzuki et al.

[11] Patent Number: 5,053,316
[45] Date of Patent: Oct. 1, 1991

[54] THERMOPLASTIC ELASTOMER AND PHOTOSENSITIVE RESIN COMPOSITION BASED THEREON, AND PRINTING PLATE PRECURSOR COMPRISING THE COMPOSITION

[75] Inventors: Yoshio Suzuki; Yutaka Usubuchi; Yakeshi Oguri, all of Fuji, Japan

[73] Assignee: Asahi Kasei Kogyokabushiki Kaisha, Japan

[21] Appl. No.: 363,169

[22] Filed: Jun. 8, 1989

[30] Foreign Application Priority Data

Jun. 10, 1988 [JP] Japan ................. 63-143052
Jul. 14, 1988 [JP] Japan ................. 63-173773

[51] Int. Cl.$^5$ ............... G03F 7/028; G03F 7/035; G03F 7/037
[52] U.S. Cl. ...................... 430/281; 430/906; 430/288; 430/285; 430/284; 522/101; 522/141; 522/144; 522/135; 522/142
[58] Field of Search .............. 430/906, 281, 288, 285, 430/284; 522/101, 141, 144, 135, 142

[56] References Cited

U.S. PATENT DOCUMENTS

| | | | |
|---|---|---|---|
| 4,317,858 | 3/1982 | Sattler | 522/101 X |
| 4,318,833 | 3/1982 | Guagliardo | 524/457 |
| 4,464,456 | 8/1984 | Fujikawa et al. | 430/281 |
| 4,889,793 | 12/1989 | Taniguchi et al. | 430/281 X |

FOREIGN PATENT DOCUMENTS

| | | |
|---|---|---|
| 0086653 | 8/1983 | European Pat. Off. . |
| 1953349 | 4/1971 | Fed. Rep. of Germany . |
| 2914619 | 10/1979 | Fed. Rep. of Germany . |
| 61-063837 | 4/1986 | Japan ................. 522/144 |

*Primary Examiner*—Cynthia Hamilton

[57] ABSTRACT

(I) A photosensitive resin composition comprising
  (i) a thermoplastic elastomer selected from
    (A) a poly(amide-imide) ester produced by reacting a polyamide-forming monomer with either an aromatic carboxylic acid or its anhydride and either a polyalkylene glycol or an α,ω-dihydroxy hydrocarbon,
    (B) a poly(amide-imide) urethane produced by reacting the above poly(amide-imide) ester with a diisocyanate compound, and
    (C) a poly(amide-imide) urethane produced by reacting the above diisocyanate compound with a mixture of polymer diol and a poly(amide-imide) ester obtained from a Chthd 2–$C_4$ alkylene glycol and a polyamide-forming monomer, and
  (ii) an ethylenic unsaturated compound, and
  (iii) a photopolymerization initiator, (II) a photosensitive sheet for printing plate formation which comprises a resin layer formed of the above composition, and (III) the above defined thermoplastic elastomer.

5 Claims, No Drawings

THERMOPLASTIC ELASTOMER AND PHOTOSENSITIVE RESIN COMPOSITION BASED THEREON, AND PRINTING PLATE PRECURSOR COMPRISING THE COMPOSITION

BACKGROUND OF THE INVENTION

1. Field of the Invention

The present invention relates to a novel photosensitive resin composition for making printing plates and to a printing plate precursor comprising this photosensitive resin composition. More specifically, the invention relates to (i) a photosensitive resin composition which is based on a thermoplastic elastomer having poly(amide-imide) segments and can be washed out with water or aqueous solution and (ii) printing plate precursor comprising said photosensitive resin composition, that is, sheets from which printing plates, particularly flexographic printing plates, are made up.

2. Description of the Prior Art

There are various polymers hitherto known as base materials of photosensitive resin compositions for making printing plates. In particular, polymers of the polyamide family have been widely used. Of these polymers, alcohol-soluble copolymer polyamides were chiefly used in the past. These polyamides, however, involve problems in handling or workability and additionally have drawbacks such that fireproof facilities are necessary for the development to make up printing plates. Accordingly, photosensitive resin compositions predominantly used today are of the type which can be washed out with water or aqueous solution.

Polyamides of this type proposed are, for example, those having sulfonic acid groups (Japanese Patent Application Kokai Nos. Sho. 48-68302 and Sho. 48-72250, and so on), those having basic nitrogen or ammonium salt type nitrogen (Japanese Patent Application Kokai Nos. Sho. 50-7605 and Sho. 50-78401, and so on), and those having ether bonds (Japanese Patent Application Kokai No. Sho. 48-42049 and Japanese Patent Publication No. Sho. 49-43565, and so on).

While flexographic printing plates made from various photosensitive resin compositions based on thermoplastic elastomers that have rubber elasticity are known as substitutes for rubber printing plates, most of such substitutes commercialized are of the type made by developing with organic solvents. The use of organic solvents, however, is problematic in public nuisance and the like, prompting investigators to search for a photosensitive elastomeric composition developable with water or aqueous solution. Thus, several compositions (e.g. Japanese Patent Publication Nos. Sho. 59-29849 and Sho. 58-33884) are proposed but none of which are commercialized because of their drawbacks such as low ink resistance.

Other proposed polymers which are superior in water-developability and provide flexible and tenacious printing plates for relief are copolymer polyamides having polyamide main chains into which polyether segments are introduced. These polymers include, for example, copolymer polyamides having constitutional units which consist of (i) polyoxyethylene terminated by amino or carboxy groups and (ii) an aliphatic dicarboxylic acid or diamine (e.g. Japanese Patent Publication Nos. Sho. 57-18173 and Sho. 57-4871) and polyetheresteramides constituted of either a lactam or nylon salt and polyoxyalkylene glycol and dicarboxylic acid (e.g. Japanese Patent Application Kokai Nos. Sho. 58-117537 and Sho. 60-14232). These polyetheresteramides having polyether segments, when forming photosensitive compositions for printing plates, exhibit relatively good characteristics, but their own transparency is insufficient and their compatibility with ethylenic unsaturated compounds used as additives in the compositions is not always high enough. Thus, these resin compositions have drawbacks such that co-usable ethylenic unsaturated compounds are limited in number and the resulting printing plates are unsatisfactory in resolving power.

SUMMARY OF THE INVENTION

An object of the present invention is to provide a base polymer of photosensitive resin compositions which overcomes such drawbacks of the prior art as noted above and is superior in transparency, mechanical properties, and heat resistance and additionally has good compatibility with ethylenic unsaturated compounds.

Another object of the invention is to provide a photosensitive resin composition which contains said base polymer, that is, a composition which can be washed out with water or aqueous solution and provide printing plates superior in resolving power and having best suited mechanical properties for relief.

A further object of the invention is to provide photosensitive resin sheets comprising said composition which are precursors of printing plates particularly for flexography.

As a result of intensive studies relating to the abovementioned disadvantages of the prior art we have developed a photosensitive composition using as a base polymer a specific thermoplastic elastomer having a poly(amide-imide) segment in the molecule. Based on this finding, the present invention has been accomplished.

DETAILED DESCRIPTION OF PREFERRED EMBODIMENTS

The thermoplastic elastomer used in the present invention is selected from the following poly(amide-imide)ester (A), poly(amide-imide)urethane (B), and poly(amide-imide)urethane (C).

The poly(amide-imide)ester (A) is produced by reacting together the following ingredients (a), (b), and (c).

Ingredient (a) is a polyamide-forming monomer selected from lactams, aminocarboxilic acids, equimolar salts of diamines with dicarboxylic acids, and water soluble polyamide-forming monomers. The monomers are preferably of 4 to 40 carbon atoms. Examples of the polyamide-forming monomer are; lactams such as caprolactam, enanthlactam, and capryllactam; aminocarboxylic acids such as ω-aminocaproic acid, ω-aminoenanthylic acid, and ω-aminocaprylic acid; and equimolar salts of hexamethylenediamine-adipic acid, hexamethylenediamine-azelaic acid, and dodecamethylenediamine-adipic acid. Water soluble polyamideforming monomers favor the improvement of the elastomer in water-solubility. Examples of them include equimolar salts of diaminopropylpiperazine-adipic acid, diaminoethylpiperazine-adipic acid, diaminopropylpiperazinedecanedicarboxylic acid, diaminoethylpiperazinedecanedicarboxylic acid, and hexamethylenediamine-sodium sulfoisophthalate. These polyamide-forming monomers may be used alone or in combination.

Ingredient (b) is an acid or acid anhydride which can form at least one imide ring, said acid or acid anhydride being selected from aromatic tricarboxylic acids, aromatic tetracarboxylic acids, and anhydrides of these two-group acids. Said aromatic tricarboxylic acids include, for example, 1,2,4-trimellitic acid, 1,2,5-naphthalenetricarboxylic acid, 2,6,7-naphthalenetricarboxylic acid, 3,3', 4-diphenyltricarboxylic acid, benzophenone-3,3',4-tricarboxylic acid, diphenylsulfone3,3',4-tricarboxylic acid, and diphenyl ether-3,3',4-tricarboxylic acid. Said aromatic tetracarboxylic acids include, for example, pyromellitic acid, diphenyl-2,2',3,3'-tetracarboxylic acid, benzophenone-2,2',3,3'-tetracarboxylic acid, diphenyl sulfone-2,2',3,3'-tetracarboxylic acid, and diphenyl ether-2,2',3,3'-tetracarboxylic acid. These aromatic polycarboxylic acids and anhydrides thereof may be used alone or in combination.

Ingredient (c) is a polyoxyalkylene glycol having a number average molecular weight of 400 to 4000 or an α,ω-dihydroxyhydrocarbon having a number average molecular weight of 400 to 4000. Such polyoxyalkylene glycols include homopolymers, e.g. polyoxyethylene glycol, polyoxypropylene glycol, polyoxytetramethylene glycol, and denatured polyoxytetramethylene glycol, and copolymers comprising two or more kinds of oxyalkylene units. Examples of the α,ω-dihydroxyhydrocarbon include the products of hydroxylating the terminals of polymers such as homopolymers of olefins and butadiene, copolymers of these unsaturated hydrocarbons with other monomers, and the products of hydrogenating the double bonds of the above terminal-hydroxylated unsaturated hydrocarbons. These ingredients (c) may be used alone or in combination.

If the number average molecular weight of the polyoxyalkylene glycol is less than 400, the resulting thermoplastic elastomer will not have the elasticity or flexibility necessary for printing plates or it may be difficult to develop the resulting resin composition with water or aqueous solution. If said molecular weight exceeds 4000, the resulting thermoplastic elastomer, in spite of containing polyoxyalkylene segments, will be liable to crystallize and hence show low transparency and the resulting printing plate will tend to exhibit low resolving power. Preferably, the number average molecular weight is in the range of 600 to 2500. This average molecular weight can be determined from the OH value.

Similarly, α,ω-dihydroxyhydrocarbons having lower number average molecular weights than 400 will tend to provide thermoplastic elastomers which do not have elasticity or flexibility necessary for printing plates and α,ω-dihydroxyhydrocarbons having number average molecular weights exceeding 4000 tend to be difficult to form high molecular weight elastomers, because the reactive sites will be reduced, and tend to result in photosensitive resin compositions difficult to develop with water or aqueous solution. Preferred number average molecular weights of the α,ω-dihydroxyhydrocarbon are in the range of 1000 to 3500.

The necessary rubber elasticity and resistance to flexographic inks, of thermoplastic elastomer can be achieved by raising the content of α,ω-dihydroxyhydrocarbon, where the joint use of a water-soluble polyamide-forming monomer or polyethylene glycol is preferable for the purpose of making the photosensitive resin composition developable with water or aqueous solution. For achieving a good balance between either the rubber elasticity or the flexographic ink resistance and the developability with water or aqueous solution, the proportion of α,ω-dihydroxyhydrocarbon to polyethylene glycol is desirably adjusted within the range of 10:1 to 1:10.

In the present invention, the poly(amide-imide)ester (A) can be produced, for instance, by mixing together the above defined polyamide-forming monomer (a), aromatic polycarboxylic acid or its anhydride (b), and polyoxyalkylene glycol or α,ω-dihydroxyhydrocarbon (c) so that the molar ratio of ingredient (b) to ingredient (c) may be substantially 1:1, more specifically in the range of 0.9:1 to 1.1:1, and heating the mixture at a temperature of about 150 to 300° C. to react together the ingredients while maintaining the water content in the reaction system within the range of 0.1 to 1% by weight, followed, if necessary, by post-polymerization under reduced pressure at a temperature of about 200 to 300° C.

It is important in this process to react the aromatic polycarboxylic acid ingredient with the polyolyalkylene glycol ingredient in a substantially equimolar ratio. If the amount of either one of them is excessive, no poly(amide-imide)ester will be produced that provides compositions superior in mechanical properties. In this process, ingredient (b), i.e. the aromatic polycarboxylic acid or anhydride thereof, reacts with ingredient (a), i.e. the polyamide-forming monomer to form imide rings, thereby providing a linear, unbranched poly(amide-imide) which has terminal carboxy groups, and further this poly(amide-imide) undergoes condensation with ingredient (c), i.e. the polyoxyalkylene glycol or α,ω-dihydroxyhydrocarbon, forming a poly(amide-imide)ester. It is conceivable that in this case, not only stepwise reactions, that is, the precedent formation of the poly(amide-imide) having terminal carboxy groups, followed by the esterification of the poly(amide-imide) to form an elastomer, always take place but also the polyamide-forming reaction, imide-forming reaction, and esterification occur in parallel with one another.

In the above production process, an esterification catalyst can be used as a polymerization accelerator. Esterification catalysts favorable for the reaction include; acid catalysts, e.g. phosphoric acid, polyphosphoric acid, and toluenesulfonic acid; zirconium catalysts, e.g. tetrabutyl zirconate; titanium catalysts, e.g. tetrabutyl orthotitanate; tin catalysts, e.g. dibutyltin oxide and dibutyltin laurate; manganese catalysts, e.g. manganese acetate; and lead catalysts, e.g. lead acetate. These catalysts may be added in the initial or middle stage of polymerization.

An example of other processes for the poly(amide-imide) ester production comprises mixing ingredient (a) with ingredient (b), heating and reacting them together to form a poly(amide-imide) having terminal carboxy groups, and adding thereto ingredient (c), i.e. the polyoxyalkylene glycol or α,ω-dihydroxyhydrocarbon in such an amount as to give a substantially equimolar ratio of ingredient (c) to ingredient (b), thereby esterifying the poly(amide-imide) to form the intended poly(amide-imide)ester.

In the present invention, the poly(amide-imide)ester (A) is a block copolymer, produced as stated above, which is constituted of poly(amide-imide)segments and polyoxyalkylene or hydrocarbon segments. This block copolymer is a soft and tenacious polymer having a superior elasticity, because the poly(amide-imide)segment has a hard segment character and the polyalkylene or hydrocarbon segment has a soft segment character. Thus, printing plates from photosensitive resin compositions based on this block copolymer are superior in mechanical properties.

Since the polyoxyalkylene segment of the poly(amide-imide)ester is hydrophilic, the unexposed area of the resulting printing plate, when it is developed, can be removed by washing with water, that is, the so-called "water washing out" of the unexposed area will be possible.

The number average molecular weight of poly(amide-imide) segments in the poly(amide-imide)ester is desirably from 400 to 4000, preferably from 400 to 3000. When said average molecular weight is less than 400, the resulting printing plate will have insufficient mechanical strength. When said average molecular weight exceeds 4000, the resulting printing plate will tend to be impaired in transparency and have undesirably low water-developability.

For the production of the poly(amide-imide)urethane (B) in the present invention, a poly(amide-imide)ester is first produced as follows: The above defined polyamide-forming monomer (a), aromatic polycarboxylic acid or anhydride thereof (b), and polyoxyalkylene glycol or α,ω-dihydroxyhydrocarbon (c) are mixed together in an ingredient (b): ingredient (c) molar ratio of 4:5 to 1:2, and are reacted together by heating; at a temperature of about 150° to 300° C. while maintaining water in the reaction system at a content of 0.1 to 1% by weight, and if necessary, the reaction mixture is subjected to post-polymerization at a temperature of about 200° to 300° C., thereby forming a poly(amide-imide)ester having polyoxyalkylene residues or α,ω-dihydroxyhydrocarbon residues at most of the terminals.

It is important in this process to react the aromatic polycarboxylic acid ingredient with the polyoxyalkylene glycol or α,ω-dihydroxyhydrocarbon ingredient in a molar ratio substantially of 4:5 to 1:2, whereby the molar ratio of carboxy groups to hydroxy groups, these groups of two kinds contributing to the condensation, can be made substantially from 4:5 to 1:2 and the resulting poly(amide-imide)ester has hydroxy groups at most of the terminals. That is, ingredient (b), i.e. the aromatic polycarboxylic acid or anhydride thereof, reacts with ingredient (a), i.e. the polyamide-forming monomer to form imide rings, thereby providing a linear, unbranched poly(amide-imide) which has terminal carboxy groups, and further this poly(amide-imide) undergoes condensation with ingredient (c), i.e. the polyoxyalkylene glycol or α,ω-dihydroxyhydrocarbon, forming such a poly(amide-imide)ester as stated above that has hydroxy groups at most of the terminals. It is also conceivable that in this case, similarly to the case of the production of poly(amide-imide)ester (A), not only stepwise reactions, that is, the precedent formation of the poly(amide-imide) having terminal carboxy groups, followed by the esterification to connect the polyoxyalkylene glycol to the poly(amide-imide), always take place but also the polyamide-forming reaction, imide-forming reaction, and esterification occur in parallel with one another.

In the above production process, an esterification catalyst can also be used as a polymerization accelerator.

After the polycondensation has been conducted as stated above, post-polymerization, if necessary, is performed, thereby providing a poly(amide-imide)ester having hydroxy groups at most of the terminals. Carboxy groups, when remaining in a large amount in this case, will hinder the next reaction with a diisocyanate compound or cause side reaction, hence providing no poly(amide-imide)urethane having favorable properties. Accordingly, the amount of remaining carboxy groups is desirably up to 10%, preferably up to 5%, of one the original quantity of carboxy groups charged.

In the present invention, the poly(amide-imide) urethane (B) can be produced by reacting the thus obtained poly(amide-imide)ester having hydroxy groups at terminals or a mixture thereof and another polymer diol, designated as ingredient (α), with a diisocyanate compound or masked diisocyanate compound, designated as ingredient (l). Examples of the polymer diol include a polyoxyalkylene glycol having a number average molecular weight of 400 to 4000, α,ω-dihydroxyhydrocarbon, and polyester diol constituted of both a polyoxyalkylene having a number average molecular weight of 400 to 4000 and an α,ω-dicarboxyhydrocarbon in a former-to-latter, molar ratio of 1.2 to 2. Examples of the diisocyanate compound include tolylene diisocyanate, diphenylmethane-4,4'-diisocyanate, hexamethylene diisocyanate, naphthylene-1,5-diidocyanate, xylylene diisocyanate, isophorone diisocyanate dicyclohexyl isocyanate, and hydrogenated xylylene diisocyanate. Suitable masking compounds for providing the masked diisocyanate compound include, for example, lactams, phenols, and lower alcohols. Of these compounds, preferred is caprolactam. The above-mentioned diisocyanate compounds, unmasked or masked, may be used alone or in combination. The diisocyanate compound or masked diisocyanate compound that is ingredient (e) needs to react with the polyoxyalkylene glycol or α,ω-dihydroxyhydrocarbon that is ingredient (c) in an ingredient (e)-to-ingredient (c) molar ratio (hereinafter referred to as "isocyanate ratio") of 0.3 to 0.65, in other words, 1 mole of terminal hydroxy groups of the poly(amide-imide)ester needs to react with about 0.6 to 1.3 moles of isocyanato groups. This reaction increases rapidly the molecular weight of the poly(amide-imide)ester of low viscosity, yielding a poly(amide-imide)urethane which is hydrophilic and transparent, has low hardness and high strength, and exhibits less permanent tensile deformation.

When the isocyanate ratio is less than 0.3, the poly(amide-imide)ester does not aquire high molecular weight and hence a useful elastomer is not produced. When the isocyanate ratio exceeds 0.65, amide portions of the (amide-imide)ester are crosslinked through diisocyanate bridges and this tends to make worse the uniformity of the intended photosensitive resin composition. Preferred isocyanate ratios are from 0.35 to 0.60 in view of mechanical properties of the elastomer and the uniformity of the photosensitive resin composition.

The poly(amide-imide)urethane used in the present invention is thermoplastic, but exhibits less permanent tensile deformation and is superior in rubber elasticity, conceivably because of being partly crosslinked. Moreover, since the melt viscosity of the poly(amide-imide)urethane varies with the isocyanate ratio, an elastomer suited for the intended photosensitive resin composition can be produced by proper choice of the isocyanate ratio.

The poly(amide-imide)urethane forming reaction is carried out desirably within the temperature range of 120° to 270° C. At lower temperatures than 120° C., the poly(amide-imide)ester is hard to melt and, if it is melted, its increasing melt viscosity will make stirring difficult before its molecular weight becomes high enough. At higher temperatures than 270° C., on the contrary, urethane bonds formed are liable to split and the reaction with the amido bonds is accelerated, making the polymerization control difficult and inducing thermal degradation of the polymers. For allowing the reaction to proceed smoothly, it is desirable to remove water from the poly(amide-imide)ester prior to the reaction with the diisocyanate compound. A solvent can be added to this urethane forming reaction system. Any solvent may be used in this case that dissolves or disperses the reactants poly(amide-imide)ester, polymer diol, and diisocyanate compound. Such solvents include high polar solvents, e.g. N-methylpyrrolidone, dimethylsulfoxide, and dimethylacrylamide, aromatic solvents, high-boiling petroleum solvents, and mixtures of these solvents.

This reaction can also be carried out at temperatures below 120° C. by using the above-mentioned solvent.

In addition, it is possible to use a known urethane formation catalyst such as an amine catalyst or an organometallic catalyst, as occasion demands.

The poly(amide-imide)urethane (B) of the present invention is an elastomer resulting from chain-extending the hydroxy-terminated poly(amide-imide)ester, obtained as stated before, with the diisocyanate compound. Said poly(amide-imide)ester is a low-viscosity polymer constituted of poly(amide-imide) segments and polyoxyalkylene or hydrocarbon segments. This polymer, upon chain extension with the diisocyanate compound, forms an elastomer of higher molecular weight. The poly(amide-imide)ester is a block copolymer constituted of poly(amide-imide)segments and polyoxyalkylene or hydrocarbon segments and the former segments have hard segment character and the latter segments have soft segment character. Therefore, the poly(amide-imide)ester, in this case, is converted by the chain extension with the diisocyanate compound into a flexible and tenacious elastomer having superior resilience and printing plates formed from photosensitive resin compositions based on this elastomer are superior in mechanical properties.

For the production of the poly(amide-imide)-urethane (c), a poly(amide-imide)ester is first produced as follows: The above defined polyamide-forming monomer (a), aromatic polycarboxylic acid or anhydride thereof (b), and an alkylene glycol of 2 to 4 carbon atoms or polyoxyalkylene glycol having a number average molecular weight of less than 400 (f) are mixed together in an ingredient (b): ingredient (f) molar ratio of 4:5 to 1:2, and are reacted together by heating at a temperature of about 150° to 300° C. while maintaining water in the reaction system at a content of 0.1 to 1% by weight, and if necessary, the reaction mixture is subjected to post polymerication at a temperature of about 200° to 300° C., thereby forming a poly(amide-imide)ester having $C_2$-$C_4$ alkylene glycol residues or residues of polyoxyalkylene glycol with a number average molecular weight of less than 400 at most of the terminals.

Subsequently, a mixture, designated as ingredient (g), of the thus obtained poly(amide-imide)ester having terminal hydroxy groups with another polymer diol is reacted with ingredient (e), i.e. the above-mentioned diisocyanate compound, in the same manner as for the synthesis of the poly(amide-imide)urethane (B), whereby the poly(amide-imide)urethane (C) can be produced.

Examples of the polymer diol which is a component of ingredient (g) include a polyoxyalkylene glycol having a number average molecular weight of 400 to 4000, $\alpha,\omega$-dihydroxyhydrocarbon, and polyester diol constituent of both a polyoxyalkylene glycol having a number average molecular weight of 400 to 4000 and an $\alpha,\omega$-carboxyhydrocarbon in a former-to-latter molar ratio of 1.2 to 2. For the purpose of providing the developability with water or aqueous solution, it is desirable to use a polymer diol mentioned above in combination with ethylene glycol or use a water-soluble polyamide-forming monomer.

The poly(amide-imide)elastomer used in the present invention is desired to have a relative viscosity of at least 1.5 as measured in m-cresol at a concentration of 0.5 wt/vol % at 30° C.

For the purpose of enhancing the heat stability of the poly(amide-imide) elastomer, it is possible to use one or more stabilizers selected from various thermal-age resistors and antioxidants. These stabilizers may be added in any stage, initial, middle, or last, of polymerization or added after polymerization. Suitable heat stabilizers include; various hindered phenols, e.g. N,N'-hexamethylenebis(3,5-di-t-butyl-4-hydroxycinnamamide), 4,4'-bis(2,6-di-t-butylphenol), and 2,2'-methylenebis(4-ethyl-6-t-butylphenol); aromatic amines, e.g. N,N'-bis($\beta$-naphthyl)-p-phenylenediamine, N,N'-diphenyl-p-phenylenediamine, and poly(2,2,4-trimethyl-1,2-dihydroquinoline); copper salts, e.g. copper chloride and copper iodide; sulfur compounds, e.g. dilauryl thiodipropionate; and phosphorus compounds.

These stabilizers in photosensitive resin compositions act as thermal polymerization inhibitors or retarders and also serve as storage stabilizers.

The content of the elastomer (A), (B), or (C) in the photosensitive resin composition of the present invention is desirably in the range of 38 to 94% by weight. When the content is less than 38% by weight, the elastomer cannot perform enough functions as a base polymer. When the content exceeds 94% by weight, the hardening of the photosensitive resin composition by actinic radiation becomes insufficient since the content of ethylenic unsaturated compound is low.

The ethylenic unsaturated compound to be used in the photosensitive resin composition of the present invention can be selected from various known ethylenic unsaturated monomers and unsaturated prepolymers. Such ethylenic unsaturated monomers include; esters of unsaturated carboxylic acids such as acrylic acid and methacrylic acid, for example, alkyl, cycloalkyl, haloalkyl, alkoxyalkyl, hydroxyalkyl, aminoalkyl, tetrahydrofurfurylallyl, glycidyl, benzyl, and phenoxy (meth)acrylates, alkylene glycol di(meth)acrylates, trimethylolpropane tri(meth)acrylate, glycerol tri(meth)acrylate and pentaerythritol tetra(meth)acrylate; (meth)acrylamide and derivative thereof, e.g. N- or N,N'-alkyl(-meth)acrylamides, N- or N,N'-hydroxyalkyl(meth)acrylamides, diacetone(meth)acrylaide, and N,N'-alkylenebis(meth)acrylamides; allylcompounds, e.g. allyl alcohol and allyl isocyanate; maleic esters and fumaric esters, e.g. alkyl, haloalkyl, and alkoxyalkyl monoesters and diesters of these acids; and other vinyl compounds, e.g. styrene, vinyltoluene, divinylbenzene, N-vinylcarbazole, and N-vinylpyrrolidone. Of these ethylenic unsaturated monomers, preferred are (meth)acryloyloxy-containing compounds such as acrylates and methacrylates. Their examples other than those cited above include diethylene glycol dimethacrylate, tetraethylene glycol dimethacrylate, 2-methacryloyloxyethyl-2-hydroxyethyl phthalate, 2-methacryloyloxyethyl-2-hydroxypropyl phthalate, 1-acryloyloxy-2-hydroxy- 3-phenoxypropane, 1-methacryloyloxy-2-hydroxy-3-phenoxypropane, phenoxyethyl acrylate, phenoxyethyl methacrylate, phenoxytetraethylene glycol acrylate, ethoxylated bisphenol A diacrylate, ethoxylated bisphenol A dimethacrylate, bis(acryloyloxyethyl)hydroxyethyl isocyanurate, tris(acryloyloxyethyl)hydroxyethyl isocyanurate, bis(methacryloyloxyethyl)hydroxyethyl isocyanurate, and tris(methacryloyloxyethyl)hydroxyethyl isocyanurate.

On the other hand, suitable ethylenic unsaturated prepolymers for use in the photosensitive resin composition are products of introducing one or more ethylenic unsaturated groups into each of polyesters, polyurethanes, polyethers, epoxy resins, acrylic resins, etc. by using an ethylenic unsaturated compound having one or more reactive groups such as carboxy, hydroxy, and isocyanoto groups.

Hence, suitable unsaturated prepolymers include unsaturated polyesters, polyurethanes, polyethers, epoxy resins, and acrylic resins. The unsaturated polyesters include; polyesters of unsaturated dibasic acids, e.g. maleic acid fumaric acid, and itaconic acid, or their anhydrides, with polyhydric alcohols, e.g. ethylene glycol, propylene glycol, 1,4-butanediol, 1,6-hexanediol, diethylene glycol, triethylene glycol, glycerol, trimethylolpropane, and pentaerythritol; polyesters resulting from replacing parts of the above-mentioned acid components by a saturated polybasic acid such as succinic acid, adipic acid, phthalic acid, isophthalic acid, phthalic anhydride, or trimellitic acid; and polyesters denaturated with a drying oil fatty acid or a semi-drying oil fatty acid. A further example of the unsaturated prepolymer is an oligoester acrylate or methacrylate produced by adding acrylic acid or methacrylic acid to an esterifying reaction systems comprising such a polybasic acid and polyhydric alcohol as cited above, and co-condensing the acids with the alcohol, where the proportions of the reactants are controlled to raise the molecular weight of product to 500 to more.

The unsaturated polyurethanes include; (i) a product of reacting a polyisocyanate, e.g. tolylene diisocyanate (TDI), diphenylmethane-4,4-diisocyanate (MDI), hexamethylene diisocyanate (HMDI), naphthylene-1,5-diisocyanate (NDI), xylylene diisocyanate (XDI), isophorone diisocyanate (IPDI), or polymethylene polyphenyl isocyanate with a hydroxy-containing ethylenic unsaturated compound, e.g. alkylene glycol mono(meth)acrylate, polyoxyalkylene glycol mono(meth)acrylate, or allyl alcohol, (ii) a product of introducing ethylenic unsaturated groups into a polyurethane compound derived from a polyol and a polyisocyanate compound by utilizing the terminal isocyanato groups or hydroxy groups of the polyurethane compound, that is a product synthesized, for example, by reacting the above-mentioned polyhydric alcohol, a polyesterpolyol (e.g. polycaprolactone diol, polyvalerolacetone diol, polyethylene adipate diol, or polypropylene diol), a polyetherpolyol (e.g. polyoxyethylene glycol, polyoxypropylene glycol, polyoxyethyleneoxypropylene, or polyoxytetramethylene glycol), or a polymer-polyol (e.g. 1,4-polybutadiene, hydrogenated or unhydrogenated 1,2-polybutadiene, butadiene-styrene copolymer, or butadiene-acrylonitrile copolymer, each having terminal hydroxy groups) with a polyisocyanate while providing an excess of isocyanato groups, and reacting the resulting polyurethane compound that has terminal isocyanato groups with an ethylenic unsaturated compound having active hydrogen such as hydroxy or amino group (e.g. an alkylene glycol mono(meth)acrylate, polyoxyalkylene glycol mono(meth)acrylate, allyl alcohol, or aminoalkyl(meth)acrylate) or hydroxy groups, and reacting the resulting polyurethane compound that has terminal hydroxy groups with an isocyanato-containing ethylenic unsaturated compound (e.g. allyl isocyanate or isocyanatoethyl methacrylate); and (iii) a product of connecting together the above-mentioned unsaturated polyester by using a polyisocyanate compound.

Examples of the unsaturated polyether include acrylates and methacrylates of polyether glycols, e.g. polyoxyethylene glycol, polyoxypropylene glycol, polyoxyethyleneoxypropylene glycol, and polyoxytetramethylene glycol.

Examples of the unsaturated epoxy resin include, for example, products of reacting a bisphenol A type epoxy compound, phenol- or cresol-novolak type epoxy compound, halogenated bisphenol compound, resorcinol type epoxy compound, and alicyclic epoxy compound separately with a carboxy-containing ethylenic unsaturated compound, e.g. acrylic acid or methacrylic acid.

Examples of the unsaturated acrylic resin include products of reacting acrylic copolymer resins obtained by using a monomer having a carboxy, hydroxy, or glycidyl group with an ethylenic unsaturated compound having a functional group which can react with one of the carboxy, hydroxy, and glycidyl groups, thereby introducing unsaturated bonds to the copolymer resins, that is, products of adding glycidyl acrylate or glycidyl methacrylate to copolymers of acrylic acid or methacrylic acid with various acrylates, methacrylates, styrene, or vinyl acetate and products of adding, conversely, acrylic acid or the like to copolymers containing glycidyl acrylate or glycidyl methacrylate.

The above stated ethylenic unsaturated compounds may be used alone or in combination in the photosensitive resin composition of the present invention. The content of the unsaturated compound is generally in the range of 5 to 60% by weight. When the content is less than 5% by weight, the hardening of the composition by actinic radiation may be insufficient. When the content exceeds 60% by weight, the resulting printing plates tend to be unsatisfactory in mechanical properties.

In the photosensitive resin composition of the present invention, various known photopolymerization initiators can be used, of which preferred are various organic carbonyl compounds, particularly aromatic carbonyl compounds. Such carbonyl compounds include (i) benzoin compounds represented by the general formula,

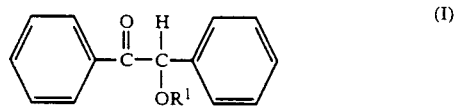

(I)

wherein $R^1$ denotes hydrogen or alkyl such as methyl, ethyl, isopropyl, or isobutyl, (ii) phenyl ketone compounds represented by the general formula,

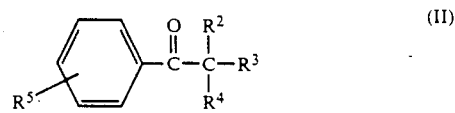

(II)

wherein $R^2$, $R^3$, $R^4$, and $R^5$ are the same or different and each denote hydrogen, halogen, alkyl, alkoxy, hydroxy, phenyl, alkylthio, or morpholino, (iii) benzophenone compounds represented by the general formula,

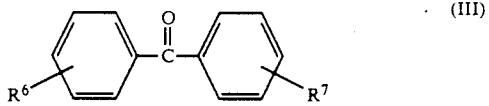 (III)

wherein $R^6$ and $R^7$ are the same or different and each denote hydrogen, alkyl, alkoxy, carboxy, alkoxycarbonyl, alkylthio, or amino, and (iv) other aromatic carbonyl compounds.

Individual examples of the benzoin compound represented by the general formula (I) are benzoin, benzoin methyl ether, benzoin ethyl ether, benzoin isopropyl ether, benzoin n-butyl ether, and benzoin isobutyl ether. Individual examples of the phenyl ketone compounds represented by the general formula (II) are dimethoxyphenylacetophenone, diethoxyphenylacetophenone, diethoxyacetophenone, 2-hydroxy-2-methylpropiophenone, 4'-isopropyl-2-hydroxy-2-methylpropiophenone, 2,2-dichloro-4'-phenoxyacetophenone, 1-hydroxycyclohexyl phenyl ketone, 4'-methylthio-2-morpholino-2-methylpropiophenone, and 4'-dodecyl-2-hydroxy-2-methylpropiophenone. Individual examples of the benzophenone compound represented by the general formula (III) are benzophenone, benzoylbenzoic acid, methyl benozylbenzoate, ethyl benzoylbenzoate, isopropyl benzoylbenzoate, 3,3'-dimethyl-4-methoxybenzophenone, 4-benzoyl-4'-methyldiphenyl sulfide, 4,4'-bisdimethylaminobenzophenone, and 4,4'-bisdiethylaminobenzophenone. Suitable other aromatic carbonyl compounds include, for example, benzyl, 4,4'-dimethoxybenzoyl, methyl phenylglyoxylate; anthraquinone compounds such as anthraquinone, 2-ethylanthraquinone, and 2-chloroanthraquinone; thioxanthone compounds such as thioxanthone, 2,4-dimethylthioxanthone, and isopropylthioxanthone; oxime ester compounds such as 1-phenyl-1,2-propanedion-2-(o-ethoxycarbonyl)oxime and 1-phenyl-1,2-propanedion-2-o-benzoyloxime; acylphosphine oxide compounds such as benzoyldiethoxyphosphine oxide and 2,4,6-trimethylbenzoyldiphenylphosphine oxide; and aminobenzoate compounds such as ethyl N,N'-dimethylaminobenzoate and isopropyl N,N'-dimethylbenzoate.

Further, other suitable organic carbonyl compounds include camphorquinone and acetoin and suitable compounds other than carbonyl compounds include imidazole dimer derivatives, e.g. 2,4,5-triphenylbisimidazole and 2-(o-chlorophenyl)-4,5-dimethoxyphenylbisimidazole.

These photopolymerization initiators may be used alone or in combination. Their amount to be used is generally in the range of 0.1 to 10% by weight based on the whole weight of the photosensitive resin composition of the present invention.

To the photosensitive resin composition a known thermal polymerization inhibitor or polymerization retarder can be added, if desirable, for the purpose of preventing the dark reaction during storage. Thermal polymerization inhibitors or polymerization retarders suitable for such purposes include; quinones, e.g. benzoquinone, hydroquinone, 2,5-di-t-butylhydroquinone, and 2,5-diphenyl-p-benzoquinone; phenols, e.g. p-methoxyphenol, 2,6-di-t-butyl-p-cresol, catechol, pyrogallol, picric acid, β-naphthol, 2,2'-methylenebis(4-methyl-6-t-butylphenol), 2,2'-thiobis(4-methyl-6-t-butylphenol), pentaerythrytoltetrakis[3-(3,5-di-b-butyl-4-hydroxyphenyl)pripionate], and tocopherol; amines, e.g. aniline, naphthylamine, N,N'-diphenyl-p-phenylenediamine, N,N'-bis(β-naphthyl)-p-phenylenediamine, N-nitrosophenylhydroxylamine, N-nitrosocyclohexylhydroxylamine, its ammonium salt, and p-nitrosodimethylamiline; and further aryl phosphite, arylalkyl phosphite, pyridine, phenothiazine, methylene blue, nitrobenzene, copper (I) chloride, and copper naphthenate. These stabilizers are used generally in an amount of 0.005 to 1% by weight based on the whole weight of the photosensitive resin composition.

As occasion demands, the photosensitive resin composition of the present invention may contain organic or inorganic fillers, dyes or pigments, and other additives, besides the above stated ingredients. Moreover, the incorporation of suitable plasticizer is favorable for the purpose of bettering the moldability or processability of the composition to form sheets for printing plate precursors as well as the flexibility of resulting printing plates. Such plasticizers include, for example, glycerol, polyethylene glycol, benzenesulfonamide, toluenesulfonamide, N-ethyltoluenesulfonamide, N-methyltoluenesulfonamide, and p-hydroxybenzoic esters.

The fabrication of photosensitive resin printing plate precursors from the composition of the present invention can be accomplished by several methods. An example of these methods comprises dissolving the ingredients of the photosensitive resin composition in water or a suitable organic solvent with sufficient mixing to form a homogeneous solution, pouring and spreading this solution uniformly to a definite thickness on supports, and removing the solvent from the spread solution by evaporation to form photosensitive layers having a thickness of 0.1 to 10.0 mm. Another example of the methods comprises heating and compressing the composition by press forming or the like to form photosensitive layers on supports. Moreover, another example of the methods comprises sufficient mixing of the ingredients of the photosensitive resin composition by using a kneader, Banbury mixer, or the like, and forming photosensitive layers, on supports, from the mix by press forming. Photosensitive layers can also be formed by cast forming or extrusion.

The photosensitive resin composition formed into sheets may be adhered directly on supports at the same time that the sheets are formed. Sheets of the photosensitive resin composition can also be adhered on supports by using an adhesive and can also be used singly as unsupported printing plate precursors. Such unsupported printing plate precursors can be formed, for instance, by the method given in Japanese Patent Publication No. Sho. 45-23615. When a supported printing plate precursor is formed, it is advantageous to interpose an anti-halation layer, besides an adhesive layer, between the support and the photosensitive layer. Suitable supports include; sheets of plastics such as polyethylene terephthalate, polypropylene, cellulose triacetate, and polycarbonate; synthetic rubber sheets, metal sheets, synthetic papers, and composites of these sheets.

There is no particular restriction on the shape of the printing plate precursor comprising the photosensitive resin composition; the composition can be used in flat sheet shapes, of course, as well as in sleeve shapes or may form photosensitive layers around cylindrical supports. The thickness of these photosensitive layers is typically in the range of 0.1 to 10.0 mm.

From a printing plate precursor comprising the photosensitive resin composition of the present invention, a printing plate that has at its surface a pattern of image in relief can be fabricated, for example, in the following manner: A transparent image carrier such a negative film is brought into intimate contact with the photosensitive layer surface of the printing plate precursor by using a vacuum frame, and irradiated with actinic radiation from a light source such as a mercury lamp, metal halide lamp, or xenon lamp to harden the image-corresponding portions of the photosensitive layer. Subsequently, the unhardened area are eluted with water or an aqueous solution by using a washing-out device of a suitable type, e.g. The brush type or the spray type. After drying, the resulting plate is subjected to post-exposure to light as occasion demands, thereby completing the printing plate fabrication.

The photosensitive resin composition of the present invention is based on a poly(amide-imide) elastomer which is superior in transparency, mechanical properties, heat resistance, etc. and additionally has good compatibility with the ethylenic unsaturated compounds used as a light-curable component. Hence the present composition can provide printing plates which are superior in sensitivity and image resolving power as well as in printing suitability and durability and have good mechanical properties.

The present invention is illustrated in more detail with reference to the following example which are not intended to imply any restriction on the invention.

EXAMPLE 1

A 500-ml separable flask equipped with a stirrer, nitrogen inlet tube, and distillate outlet tube was charged with 137 g of a polyoxyethylene glycol (number average molecular weight 1372), 19.2 g of trimellitic anhydride, 50.9 g of ε-caprolactam, and 0.21 g of N,N'-hexamethylenebis(3,5-di-t-butyl-4-hydroxycinnamamide) (an antioxidant supplied by Ciba-Geigy Corp. under the tradename of Irganox 1098). After 4-hour reaction at 260° C. under a nitrogen atmosphere, 0.42 g of tetraisopropyl orthotitanate was added to the reaction mixture and then the unreacted ε-caprolactam was evaporated away at 260° C. under reduced pressure. Further reaction for 4 hours under reduced pressure gave a pole yellow elastomer. In this case the amount of ε-caprolactam recovered was 16.1 g, from which the content of polyoxyethylene segments in this elastomer was calculated as 72 wt % and the number average molecular weight of poly(amide-imide) segments as 540. The relative viscosity of this elastomer was 2.32.

Subsequently, 50 g of this elastomer was dissolved in 500 ml of methanol and to this solution were added 5 g of N-ethyltoluenesulfonamide, 10 g of an acryl oligo-ester monomer (structural formula

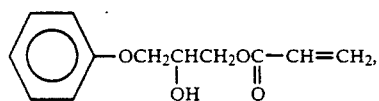

tradename M-600A, supplied by Kyoei-sha Yushi Co., Ltd.) having a hydroxy group, 10 g of ethoxylated bisphenol A diacrylate, 1.5 g of 2,2'-dimethoxyphenylacetophenone, and 0.08 g of 2,6-di-t-butyl-p-cresol, forming a uniform solution, from which methanol was then removed by evaporation, yielding a uniform, transparent composition.

A 500-μm thick layer of this transparent photosensitive resin composition was laminated on a 100-μm thick polyester film through an adhesive by holding the above-obtained resin composition between a 100 μm thick uncoated polyester film and a 100 μm thick polyester film precoated with an adhesive, putting it inside a 0.7 mm thick spacer frame, and compressing it at 120° C., 150 kg/cm², and stripping the uncoated film.

Next, a negative film having an image of letters and pictures was placed on the thus-obtained printing plate precursor, which was then exposed for 10 minutes to radiation incident on the negative film side from an ultraviolet fluorescent lamp at an ultraviolet light intensity of 2.5 mW/cm². Thereafter the negative film was peeled off, and the unexposed portions of the photosensitive resin layer were removed by brushing for 5 minutes in neutral water at 30° C. using a commercially available developing device of the brush type. After drying, the developed plate was exposed to light for 20 minutes by using the above light source under the same conditions, thus forming a letterpress plate.

Upon printing by using this letterpress plate and a rotary letterpress machine, sharp images were obtained without substantial fattening of the image, the ink transfer and ink coverage were good, and the letterpress plate exhibited high printing durability and excellent resolution.

EXAMPLE 2

A 500-ml separable flask equipped with a stirrer, nitrogen inlet tube, and distillate outlet tube was charged with 137 g of a polyoxyethylene glycol (number average molecular weight 1372), 19.2 g of trimellitic anhydride, 52.4 g of hexamethylenediamine-adipic acid equimolar salt, and 0.21 g of Irganox 1098. After 4-hour reaction at 260° C. under a nitrogen atmosphere, 0.42 g of tetraisopropyl orthotitanate was added to the reaction mixture and the reaction was further continued for 4 hours at 260° C. under reduced pressure, giving a pale yellow elastomer. The content of polyoxyethylene segments in this elastomer was 69 wt %, the number average molecular weight of poly(amide-imide) segments 608, and the relative viscosity of this elastomer 2.29.

Subsequently, 50 g of this elastomer was dissolved in 500 ml of methanol and thereto were added 5 g of N-ethyltoluenesulfonamide, 10 g of an acryl oligo ester monomer (M-600A), 10 g of ethoxylated bisphenol A diacrylate, 1.5 g of 2,2'-dimethoxyphenylacetophenone, and 0.08 g of 2,6-di-t-butyl-p-cresol, forming a uniform solution, from which methanol was then removed by evaporation, yielding a uniform, transparent composition.

A layer of the thus obtained composition was laminated on a 100-μm thick polyester film using an adhesive to form a printing plate precursor having a 500-μm thick transparent, photosensitive resin layer.

Next place, a negative film having an image of letters and pictures was placed on the photosensitive resin layer. The printing plate precursor in this state was exposed for 10 minutes to radiation incident on the negative film side from an ultraviolet fluorescent lamp at an ultraviolet light intensity of 2.5 mW/cm². Then the negative film was peeled off, and the unexposed portions of the photosensitive resin layer were removed by brushing for 5 minutes in neutral water at 30° C.

using a commercially available developing device of the brush type. After drying, the developed plate was exposed to light for 20 minutes by using the above light source under the same conditions, thus forming a letterpress plate.

Upon printing by using this letterpress plate and a rotary letterpress machine, sharp images were obtained without substantial fattening of the image, the ink transfer and ink coverage were good, and the letterpress plate exhibited high printing durability and excellent resolution.

EXAMPLE 3

A 500-ml separable flask equipped with a stirrer, nitrogen inlet tube, and distillate outlet tube was charged with 81.5 g each of two polyoxyethylene glycols (number average molecular weights 1372 and 2009), 19.2 g of trimellitic anhydride, 56.5 g of $\epsilon$-caprolactam, and 0.21 g of Irganox 1098. After 4-hour reaction at 260° C. under a nitrogen atmosphere, 0.47 g of zirconium t-butoxide was added to the reaction mixture and then the unreacted $\epsilon$-caprolactam was evaporated away at 260° under reduced pressure. Further reaction for 4 hours under reduced pressure gave a pale yellow elastomer. In this case the amount of $\epsilon$-caprolactam recovered was 17.7 g, from which was calculated the content of polyoxylene segments in this elastomer as 75 wt % and the number average molecular weight of poly(amide-imide) segments as 580. The relative viscosity of this elastomer was 2.50.

Subsequently, 50 g of this elastomer was dissolved in 500 ml of methanol and to this solution were added 5 g of N-ethyltoluenesulfonamide, 15 g of 2-methacryloyloxyethyl-2-hydroxypropyl phthalate, 15 g of ethoxyplated bisphenol A diacrylate, 1.7 g of 2,2'-dimethoxyphenylacetophenone, and 0.08 g of 2,6-di-t-butyl-p-cresol, forming a uniform solution, from which methanol was removed by evaporation, yielding a uniform, transparent composition.

A 500-$\mu$m thick layer of this transparent photo-sensitive resin composition was laminated on a 100-$\mu$m thick polyester film using an adhesive to prepare a printing plate precursor.

Next, a negative film having an image of letters and pictures was placed on the printing plate precursor, which was then exposed for 8 minutes to radiation incident on the negative film side from an ultraviolet fluorescent lamp at an ultraviolet light intensity of 2.5 mW/cm$^2$. Thereafter the negative film was peeled off, and the unexposed portions of the photosensitive resin layer were removed by brushing for 5 minutes in neutral water at 30° C. using a commercially available developing device of the brush type. After drying, the developed plate was exposed to light for 20 minutes by using the above light source under the same conditions, thus forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 4

A 500-ml separable flask equipped with a stirrer, nitrogen inlet tube, and distillate outlet tube was charged with 68.5 g of a polyoxyethylene glycol (number average molecular weight 1372), 83.3 g of a hydrogenated polybutadiene (tradename GI-1000, number average molecular weight 1665, supplied by Nihon Soda Co., Ltd.), 19.2 g of trimellitic anhydride, 62.2 g of $\epsilon$-caprolactam, 0.66 g of polyphosphoric acid, and 0.21 g Inganox 1098. After 3-hour reaction at 260° C. under a nitrogen atmosphere, the unreacted $\epsilon$-caprolactam was evaporated away under reduced pressure. Further reaction for 3 hours under reduced pressure gave a pale yellow elastomer. In this case the amount of e-caprolactam recovered was 17.5 g, from which was calculated the content of polyoxyethylene segment in this elastomer as 68 wt % and the number average molecular weight of poly(amide-imide) segment as 639. The relative viscosity of this elastomer was 2.05.

Subsequently, 50 g of this elastomer was kneaded together with 5 g of N-ethyltoluenesulfonamide, 10 g of M-600A, 10 g of ethoxylated bisphenol A diacrylate, 1.5 g of 2,2'-dimethoxyphenylacetophenone, and 0.08 g of 2,6-di-t-butyl-p-cresol at 160° C. under a nitrogen atmosphere by using a kneader, yield a uniform, transparent composition.

A 500-$\mu$m thick layer of this transparent photosensitive resin composition was laminated on a 100-$\mu$m thick polyester film using an adhesive to prepare a printing plate precursor.

In the next place, a negative film having an image of letters and pictures was placed on the printing plate precursor, which was then exposed for 10 minutes to radiation incident on the negative film side from an ultraviolet fluorescent lamp at an ultraviolet light intensity of 2.5 mW/cm$^2$. Thereafter the negative film was peeled off, and the unexposed portions of the photosensitive resin layer were removed by brushing for 5 minutes in neutral water at 30° C. using a commercially available developing device of the brush type. After drying, the developed plate was exposed to light for 20 minutes by using the light source under the same condition, thus forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 5

A 500-ml separable flask equipped with a stirrer, nitrogen inlet tube, and distillate outlet tube was charged with 137 g of a polyoxyethylene glycol (number average molecular weight 1372), 21.0 g of trimellitic acid, 50.9 g of $\epsilon$-caprolactam, and 0.21 g of Irganox 1098. After 4-hour reaction at 260° C. under a nitrogen atmosphere, 0.63 g of polyphosphoric acid was added to the reaction mixture and then the unreacted caprolactam was evaporated away at 260° C. under reduced pressure. Further reaction for 6 hours under reduced pressure gave a pale yellow elastomer. In this case, the amount of $\epsilon$-caprolactam recovered was 16.6 g, from which was calculated the content of polyoxyethylene segments in this elastomer as 72 wt % and the number average molecular weight of poly(amide-imide) segments as 535. The relative viscosity of this elastomer was 2.25.

Subsequently, 100 g of this elastomer was kneaded together with 10 g of N-ethyltoluenesulfonamide, 0.15 g of 2,6-di-t-butyl-p-cresol, 0.30 g of octylated diphenylamine, 20 g of M-600A, and 20 g of ethoxylated bisphenol A diacrylate at 200° C. under a nitrogen atmosphere by using a kneader, yielding a uniform, transparent composition.

A 500-μm thick layer of this transparent photosensitive resin composition was laminated on a 100-μm thick polyester film using an adhesive to prepare a printing plate, precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 6

A 500-ml separable flask equipped with a stirrer, nitrogen inlet tube, and distillate outlet tube was charged with 180.8 g of a polyoxyethylene glycol (number average molecular weight 2009), 20.1 g of a polyoxytetramethylene glycol (number average molecular weight 2010), 19.2 g of trimellitic anhydride, 56.5 g of ε-caprolactam, and 0.21 g of Irgamox 1098. After 4-hour reaction at 260° C. under a nitrogen atmosphere, 0.42 g of tetraisopropyl orthotitanate was added to the reaction mixture and then the unreacted ε-caprolactam was evaporated away at 260° under reduced pressure. Further reaction for 4 hour under reduced pressure gave a pale yellow elastomer. In this case, the amount of ε-caprolactam recovered was 17.2 g, from which was calculated the total content of polyoxyethylene segments and polyoxytetramethylene segments as 77 wt % and the number average molecular weight of poly(amide-imide) segments as 585. The relative viscosity of this elastomer was 2.25.

Subsequently, 50 g of this elastomer was dissolved in 500 ml of methanol and to this solution were added 5 g of N-ethyltoluenesulfonamide, 10 g of M-600A, 10 g of bisacryloyloxyethyl-hydroxyethyl isocyanate, 0.6 g of 2,2'-dimethoxyphenylacetophenone, and 0.03 g of 2,6-di-t-p-cresol, forming a uniform solution, from which methanol was removed by evaporation, yielding a uniform, transparent composition.

A 500-μm thick layer of the thus obtained transparent photosensitive resin composition was laminated on a 100-μm thick polyester film using an adhesive to prepare a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 7

A 500-ml separable flask equipped with a stirrer, nitrogen inlet tube, and distillate outlet tube was charged with 57.6 g of trimellic anhydride, 144.8 g of ε-caprolactam, 2 g of water, and 0.2 g of poly(2,2,4-trimethyl-1,2-dihydroquinoline). After 5-hour reaction at 260° C. under a nitrogen atmosphere, water was gradually evaporated away from the reaction mixture and further the unreacted ε-caprolactam was evaporated away at 260° C. under reduced pressure. Further reaction continued for 1.5 hour under reduced pressure gave a poly(amide-imide) having carboxy groups at the terminals. In this case, the amount of ε-caprolactam recovered was 7.7 g, from which was calculated the number average molecular weight of this poly(amide-imide) as 649.

Subsequently, a 300-ml separable flask equipped with a stirrer, nitrogen inlet tube, and distillate outlet tube was charged with 32.5 g of the above obtained poly(amide-imide), 68.6 g of a polyoxyethylene glycol (number average molecular weight 1372), and 0.20 g of zirconium t-butoxide. This mixture was subjected to reaction at 260° C. for 1.5 hours under reduced pressure, yielding a pale yellow elastomer, the relative viscosity of which was 2.40.

Further, a 300-ml separable flask equipped with a stirrer, nitrogen inlet tube, and distillate outlet tube was charged with 80 g of the above obtained elastomer and 8 g of N-ethyltoluenesulfonamide, which were melted uniformly at 200° C. under a nitrogen atmosphere. To this mixture was added dropwise a uniform solution composed of 16 g of M-600A, 16 g of ethoxylated bisphenol A diacrylate, 2.4 g of 2,2'-dimethoxyphenylacetophenone, and the whole mixture was stirred for 1 hour to yield a uniform, transparent composition.

A 500-μm thick layer of the thus obtained transparent photosensitive resin composition was laminated on a 100-μm thick polyester film using an adhesive to prepare a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 8

A 2000-ml separable flask equipped with a stirre, nitrogen inlet tube, and distillate outlet tube was charged with 794.4 g of a polyoxyethylene glycol, 76.8 g of trimellitic anhydride, 293.6 g of ε-caprolactam, and 1.2 g of Irganox 1098. After 5-hour reaction at 260° C. under a nitrogen atmosphere, the unreacted ε-caprolactam was evaporated away at 260° C. under reduced pressure and then 2.33 g of tetraiosropyl orthotitanate was added to the residue. Further reaction for 1.5 hour at 260° C. under reduced pressure gave a pale yellow poly(amide-imide) ester having hydroxy groups at the terminals.

In this case, the amount of ε-caprolactam recovered was 100.4 g, from which the number average molecular weight of this oligomer was calculated as 2625.

Subsequently, a 300-ml separable flask equipped with a stirrer, nitrogen inlet tube, and distillate outlet tube was charged with 105 g of the above obtained poly(amide-imide) ester, which was then melted at 200° C. under a nitrogen atmosphere and 6.05 g of hexamethylene diisocyanate was added to the melt to react. The reaction for 30 minutes gave a pale yellow elastomer, the relative viscosity of which was 2.19.

Then 50 g of this elastomer was dissolved in 500 ml of methanol and to this solution were added 5 g of N-ethyltoluenesulfonamide, 10 g of M-600A, 10 g of ethoxylated bisphenol A diacrylate, 1.5 g of 2,2'-dimethoxyphenylacetophenone, and 0.08 g of 2,6-di-t-butyl-p- cresol to form a uniform solution. Removal of the methanol from the solution by evaporation gave a uniform, transparent composition.

A 500-μm thick layer of the thus obtained transparent photosensitive resin composition was laminated on a 100-μm thick polyester film using an adhesive to form a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink coverage were good, and the letterpress plate exhibited high printing durability and excellent resolution.

EXAMPLE 9

A 300-ml separable flask equipped with a stirrer, nitrogen inlet tube, and distillate outlet tube was charged with 105 g of the poly(amide-imide) ester prepared in Example 8, which was then melted at 200° C. under a nitrogen atmosphere. To this melt 6.38 g of hexamethylene diisocyanate was added and reacted for 30 minutes, giving a pale yellow elastomer, the relative viscosity of which was 2.50.

Subsequently, 50 g of this elastomer was dissolved in 500 ml of methanol and to this solution were added 5 g of N-ethyltoluenesulfonamide, 10 g of M-600A, 10 g of bisacryloyoxyethylhydroxyethyl isocyanurate, 0.6 g of 2,2'-dimethoxyphenylacetophenone, and 0.03 g of 2,6-di-t-butyl-p-cresol, forming a uniform solution. The methanol was removed therefrom by evaporation, yielding a uniform, transparent composition.

A 500-μm thick layer of this transparent photosensitive resin composition was laminated on a 100-μm thick polyester film using an adhesive to form a printing plate precursor, which was then subjected successively to light exposure, development, drying, and post-exposure according to the procedure of Example 4, forming a letterpress plate.

Upon printing by using this letterpress plate and a letterpress machine, sharp images were obtained without substantial fattening of the image, the ink transfer and ink coverage were good, and the letterpress plate exhibited high printing durability and excellent resolution.

EXAMPLE 10

A 1000-ml separable flask equipped with a stirrer, nitrogen inlet tube, and distillate outlet tube was charged with 52.5 g of the poly[amide-imide) ester prepared in Example 8 and 28.7 g of a polybutadiene (tradename G-1000, number average molecular weight 1436, supplied by Nihon Soda Co., Ltd.) having hydroxy groups at the terminals. Under a nitrogen atmosphere, 325 g of N-methylpyrrolidone was added to the polymer mixture with stirring at 120° C. to form a solution, to which then 6.38 g of hexamethylene diisocyanated was added and reacted for 1 hour, yielding a pale yellow elastomer, the relative viscosity of which was 2.12.

Subsequently, 50 g of this elastomer was kneaded together with 5 g of N-ethyltoluenesulfonamide, 10 g of M-600A, 10 g of bisacryloyloxyethylhydroxyethyl isocyanurate, 0.6 g of 2,2'-dimethoxyphenylacetophenone, and 0.03 g of 2,6-di-t-butyl-p-cresol at 160° C. under a nitrogen atmosphere by using a kneader, yielding a uniform, transparent composition.

A 500-μm thick layer of the thus obtained transparent photosensitive resin composition was laminated on a 100-μm thick polyester film using an adhesive to form a printing plate presursor, which was then subjected successively to light exposure, development, drying, and post-exposure according to the procedure of Example 4, forming a letterpress plate.

Upon printing by using this letterpress plate and a rotary letterpress machine, sharp, images were obtained without substantial fattening of the image, the ink transfer and ink-coverage were good, and the letterpress plate exhibited high printing durability and excellent resolution.

EXAMPLE 11

A 2000-ml separable flask equipped with a stirrer, nitrogen inlet tube, and distillate outlet tube was charged with 794.4 g of a polyoxyethylene glycol (number average molecular weight 993), 76.8 g of trimellitic anhydride, 293.6 g of ε-caprolactam, 3.5 g of polyphosphoric acid, and 1.2 g of Irganox 1098. After 5-hour reaction at 260° C. under a nitrogen atmosphere, the unreacted ε-caprolactam was evaporated away at 260° C. under reduced pressure. Further reaction for 1.5 hours under reduced pressure gave a pale yellow poly(amide-imide) ester having hydroxy groups at the terminals. In this case the amount of e-caprolactam recovered was 106.4 g, from which the number average molecular weight of this poly(amide-imide) ester was calculated as 2610.

Subsequently, a 300-ml separable flask equipped with a stirrer, nitrogen inlet tube, and distillate outlet tube was charged with 104.4 g of the above obtained poly(amide-imide) ester, which was then melted at 200° C. under a nitrogen atmosphere. To this melt, 6.05 g of hexamethylene diisocyanate was added and reacted for 1.5 hours, yielding a pale yellow elastomer, the relative viscosity of which was 2.20.

Further, a 3000-ml separable flask equipped with a stirrer, nitrogen inlet tube, and distillate outlet tube was charged with 80 g of the above elastomer and 8 g of N-ethyltoluenesulfonamide, which were then melted uniformly at 200° C. under a nitrogen atmosphere. To this melt was added dropwise a uniform solution composed of 16 g of M-600A, 16 g of ethoxylated bisphenol A diacrylate, 2.4 g of 2,2'-dimethoxyphenylacetophenone, 0.12 g of 2,6-di-t-butyl-p-cresol, and 0.25 g of octylated diphenylamine, and the mixture was stirred for 1 hour, yielding a uniform, transparent composition.

A 500-μm thick layer of this transparent photosensitive resin composition was laminated on a 100-μm thick polyester film using an adhesive to form a printing plate precursor, which was then subjected successively to light exposure, development, drying, and post exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 12

A 300-ml separable flask equipped with a stirrer, nitrogen inlet tube, and distillate output tube was charged with 104.4 g of the poly(amide-imide) ester prepared in Example 11. This poly(amide-imide) ester was melted at 200° C. under a nitrogen atmosphere and then 6.38 g of hexamethylene diisocyanate was added and reacted therewith for 1.5 hours, yielding a pale yellow elastomer, the relative viscosity cf which was 2.65.

Subsequently, 100 g of this elastomer was kneaded together with 10 g of N-ethyltoluenesulfonamide, 3.0 g of 2,2'-dimethoxyphenylacetophenone, 0.15 g of 2,6-di-t-butyl-p-cresol, 0.30 g of octylated diphenylamine, 20 g of M-600A, and 20 g of ethoxylated bisphenol A diacrylate at 200° C. under a nitrogen atmosphere by using a kneader, yielding a uniform, transparent composition.

A 500-μm thick layer of this transparent photosensitive resin composition was laminated on a 100-μm thick polyester film using an adhesive, forming a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letter-press plate exhibited high printing durability and excellent resolution.

EXAMPLE 13

A 500-ml separable flask equipped with a stirrer, nitrogen inlet tube, and distillate outlet tube was charged with 397.2 g of a polyoxyethylene glycol (number average molecular weight 993), 548.8 g of a polyoxyethylene glycol (number average molecular weight 1372), 126.0 g of trimellitic acid, 316.4 g of ε-caprolactam, and 1.3 g of Irganox 1098. After 5-hour reaction at 260° C. under a nitrogen atmosphere, the unreacted ε-caprolactam was evaporated away at 260° C. under reduced pressure and then 2.60 g of zirconium t-butoxide was added to the residual reaction mixture. Further reaction for 1.5 hours under reduced pressure gave a pale yellow poly(amide-imide) ester. In this case the amount of ε-caprolactam recovered was 102.3 g, from which the number average molecular weight of this poly(amide-imide) ester was calculated as 3056.

Subsequently, a 300-ml separable flask equipped with a stirrer, nitrogen inlet tube, and distillate outlet tube was charged with 122 g of the above poly(amide-imide) ester, which was then melted at 200° C. under a nitrogen atmosphere and 6.05 g of hexamethylene diisocyanate was added and reacted with the melt for 30 minutes, yield a pale yellow elastomer, the relative viscosity of which was 2.18.

Then 50 g of this elastomer was dissolved in 500 ml of methanol and to this solution were added 5 g of N-ethyltoluenesulfonamide, 10 g of M-600A, 10 g of bisacryloyloxyethyl-hydroxyethyl isocyanurate, 0.60 g of 2,2'-dimethoxyphenylacetophenone, and 0.03 g of 2,6-di-t-butyl-p-cresol to form a uniform solution. The methanol was removed from this solution by evaporation, yielding a uniform transparent composition.

A 500-μm layer of this transparent photosensitive resin composition was laminated on a 100-μm thick polyester film using an adhesive to form a printing plate precursor, which is then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 14

A 2000-ml separable flask equipped with a stirrer, nitrogen inlet tube, and distillate outlet tube was charged with 345.6 g of an equimolar salt of sodium 3,5-dicarboxybenzenesulfonate with hexamethylenediamine, 57.6 g of trimellitic anhydride, 508.5 g of ε-caprolactam, 0.9 g of Irganox 1098, and 2.7 g of polyphosphoric acid. The reaction was conducted at 260° C. for 6 hours under a nitrogen atmosphere and further at 260° C. for 1.5 hours under reduced pressure while removing ε-caprolactam by evaporation, thus yielding a pale yellow poly(amide-imide). In this case the amount of ε-caprolactam recovered was 48.3 g, from which the number average molecular weight of this poly(amide-imide) was calculated as 2806.

Subsequently, a 500-ml separable flask equipped with a stirrer, nitrogen inlet tube, and distillate outlet tube was charged with 84.2 g of the above obtained poly(amide-imide), 93 g of ethylene glycol, 0.78 g of Irganox 1098, and 0.54 g of polyphosphoric acid. After 4-hour reaction at 220° C. under a nitrogen atmosphere, the unreacted ethylene glycol was evaporated away, yielding a pale yellow poly(amide-imide) ester having hydroxy groups at the terminals. The number average molecular weight of this poly(amide-imide) ester, calculated from the hydroxy value, was 2898.

Then, a 1000-ml separable flask equipped with a stirrer, nitrogen inlet tube, and distillate outlet tube was charged with 43.5 g of the above poly(amide-imide) ester having hydroxy groups at the terminals and subsequently with 391.5 g of N-methylpyrrolidone, which were stirred at 150° C. to form a solution. The poly(amide-imide) ester in solution was reacted with 5.0 g of hexamethylene diisocyanate at 150° C. for 30 minutes while adding it dropwise.

Further, 73.7 g of an N-methylpyrrolidone solution of 25 wt % of a polyethylene glycol (number average molecular weight 614) was added dropwise to the reaction product mixture at 150° C. over 30 minute to react with the product polymer, thereby yielding an N-methylpyrrolidone solution of poly(amide-imide) ester having polyethylene glycol residues at the terminals. This poly(amide-imide) ester in solution was further reacted with 5.0 g of hexamethylene diisocyanate at 150° C. for 30 minutes while adding it dropwise. Then 273 g of an N-methylpyrrolidone solution of 25 wt % of polybutadiene (tradename G-2000, number average molecular weight 2276, supplied by Nihon Soda Co., Ltd.) having hydroxy groups at the terminals was added dropwise to the above reaction product solution at 150° C. over 30 minute to react the polybutadiene with the product, thereby yielding a poly(amide-imide) ester having hydroxypolybutadiene groups at the terminals. This poly(amide-imide) ester was further reacted with 2.14 g of hexamethylene diisocyanate at 150° C. for about 1 hour while adding it dropwise, where some polymer precipitate appeared. The reaction was conducted for 2 hours in all and then the N-methylpyrrolidone was evaporated away, yielding a pale yellow elastomer, the relative viscosity of which was 1.95.

Subsequently, 50 g of this elastomer was kneaded together with 5 g of N-ethyltoluenesulfonamide, 0.08 g of 2,6-di-t-butyl-p-cresol, 1.5 g of 2,2'-dimethxyphenylacetophenone, 15 g of lauryl methacrylate, and 5 g of polyethylene glycol 400 dimethacrylate (tradename NK ESTER 9G, supplied by Shin-Nakamura Kagaku-Kogyo Co., Ltd.) at 150° C. under a nitrogen atmosphere by using a kneader, yielding a uniform, transparent composition.

A 500-μm thick layer of this transparent photosensitive resin composition was laminated on a 100-μm thick polyester film using an adhesive to form a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 15

A 300-ml separable flask equipped with a stirrer, nitrogen inlet tube, and distillate outlet tube was charged with 110.9 g of a hydrogenated polybutadiene (tradename CI-1000, number average molecular weight 2217, supplied by Nihon Soda Co., Ltd.) having carboxy groups at the terminals, 61.4 g of a polyethylene glycol (number average molecular weight 614), and 0.52 g of tetraisopropyl orthotitanate. Reaction at a 60° C. for 3 hours under reduced pressure gave a pale yellow polyethylene glycol derivative having a structure in which a polyethylene group of the polyethylene glycol is attached to each terminal of the hydrogenated polybutadiene through an ester linkage (polyethylene chain

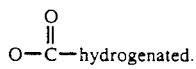

polybutadiene chain). The number average molecular weight of this polyethylene glycol derivative was 3247 as calculated from the found hydroxy value.

Then a 1000-ml separable flask equipped with a stirrer, nitrogen inlet tube, and distillate outlet tube was charged with 32.5 g of the above obtained polyethylene glycol derivative (number average molecular weight 3247) and 29.0 g of the poly(amide-imide) ester (number average molecular weight 2898, prepared in Example 14) having hydroxy groups at the terminals, and subsequently with 246 g of N-methylpyrrolidone. The mixture was stirred at 130° C. to form a solution, and further 3.02 g of hexamethylene diisocyanate together with 0.09 g of dibutyltin laurate was added dropwise and reacted at 130° C. for 1 hour. The N-methylpyrrolidone was removed from the resulting mixture by evaporation, yielding a pale brown elastomer, the relative viscosity of which was 2.00.

Then 50 g of this elastomer was kneaded together with 5 g of N-ethyltoluenesulfonamide, 0.08 g of 2,6-di-t-butyl-p-cresol, 1.5 g of 2,2'-dimethoxyphenylacetopheno 10 g of M-600A, 5 g of lauryl methacrylate, and 5 g of a polyethylene glycol 400 dimethacrylate (NK ESTER 9G, the same as used in Example 14) at 150° C. under a nitrogen atmosphere by using a kneader, yielding a uniform, transparent composition.

A 500-μm thick layer of this transparent photosensitive resin composition was laminated on a 100-μm thick polyester film using an adhesive to form a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 16

A 2000-ml separable flask equipped with a stirrer, nitrogen inlet tube, and distillate outlet tube was charged with 346 g of an equimolar salt of adipic acid with N,N-bis(3-aminopropyl)piperazine, 3,5-dicarboxybenzenesulfonate with hexamethylenediamine, 96 g of trimellitic anhydride, 452 of ε-caprolactam, and 0.9 g of Irganox 1098. The reaction was conducted at 210 for 6 hours under a nitrogen atmosphere and further at 210° C. for 2.0 hours under reduced pressure while removing ε-caprolactam by evaporation, thus yielding a pale yellow poly(amide-imide). In this case the amount of ε-caprolactam recovered was 113 g. The number average molecular weight of this poly(amide-imide) was 1510 as calculated from the found acid value.

Then a 500-ml separable flask equipped with a stirrer, nitrogen inlet tube, and distillate outlet tube was charged with 151 g of the above obtained poly(amide-imide), 202.6 g of a polyethylene glycol (number average molecular weight 1013), 0.29 g of Irganox 1098, and 0.58 g of tetraisopropyl orthotitanate. Reaction was conducted at 220° C. for 4 hours under reduced pressure, giving a pale yellow poly(amide-imide) ester having hydroxy groups at the terminals. The calculated number average molecular weight of this poly(amide-imide) ester was 3500.

Further, a 1000-ml separable flask equipped with a stirrer, nitrogen inlet tube, and distillate outlet tube was charged with 70.0 g of the above poly(amide-imide) ester having hydroxy groups at the terminals and 45.5 g of a polybutadiene (G-2000, number average molecular weight 2276, the same as used in Example 14) having hydroxy groups at the terminals and subsequently with 463 g of N-methylpyrrolidone. The mixture was stirred at 100° C. to form a solution, and further 6.05 g of hexamethylene diisocyanate together with 0.15 g of dibutyltin laurate was added dropwise and reacted at 100° C. for 2 hours. The N-methylpyrrolidone was removed from the resulting solution by evaporation, yielding a pale brown elastomer, the relative viscosity of which was 1.88.

Then 50 g of this elastomer was kneaded together with 5 g of N-ethyltoluenesulfonamide, 0.08 g of 2,6-di-t-butyl-p-cresol, 1.51 g of 2,2'-dimethoxyphenylacetophen 5 g of M-600A, 5 g of lauryl methacrylate, 5 g of NK-ESTER 9G, and 5 g of diethylene glycol dimethacrylate at 150° C under a nitrogen atmosphere by using a kneader, yielding a uniform transparent composition.

A 500-μm thick layer of this transparent photosensitive resin composition was laminated on a 100-μm thick polyester film using an adhesive to form a printing plate precursor, which was then subjected successively to light exposure, development, drying, and post-exposure press plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 17

A 1000 ml separable flask equipped with a stirrer, nitrogen inlet tube, and distillate outlet tube was charged with 70.0 g of the poly(amide-imide) ester (number average molecular weight 3500, prepared in Example 16) having hydroxy groups at the terminals, 14.4 g of a polyethylene glycol (number average molecular weight 1439), and 24.8 g of a hydrogenated polybutadienediol (number average molecular weight 2477) (tradename GJ-2000, supplied by Nihon Soda Co., Ltd.) and subsequently with 43.7 g of N-methylpyrrolidone. This mixture was stirred at 150° C., forming a solution, and further 6.05 g of hexamethylene diisocyanate together with 0.10 g of dibutyltin laurate was added dropwise and reacted at 150° C. for 1 hour. Removal of the N-methylpyrrolidone from the resulting solution by evaporation gave a pale brown elastomer, the relative viscosity of which was 1.97.

Then 50 g of this elastomer was kneaded together with 5 g of N-ethyltoluenesulfonamide, 0.08 g of 2,6-di-t-butyl-p-cresol, 1.5 g of 2,2'-dimethoxyphenylacetophenone, 5 g of M-600A, 5 g of lauryl methacrylate, 5 g of NK-ESTER 9G, and 5 g of diethylene glycol dimethacrylate at 150° C. under a nitrogen atmosphere by using a kneader, yielding a uniform, transparent composition.

A 500-μm thick layer of this transparent photosensitive resin composition was laminated on a 100-μm thick polyester film using an adhesive to form a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image, the ink transfer and ink-coverage were good, and the letterpress plate exhibited high printing durability and excellent resolution.

EXAMPLE 18

A 1000-ml separable flask equipped with a stirrer, nitrogen inlet tube, and distillate outlet tube was charged with 70.0 g of the poly(amide-imide) ester (number average molecular weight 3500, prepared in Example 16) having hydroxy groups at the terminals and 65.0 g of the polyethylene glycol derivative (number average molecular weight 3247, prepared in Example 15) and subsequently with 541 of N-methylpyrrolidone. This mixture was stirred at 120° C. to form a solution, and further 6.05 g of hexamethylene diisocyanate was added dropwise to the solution and reacted at 120° C. for 1 hour. Removal of the N-methylpyrrolidone from the resulting solution by evaporation gave a pale yellow elastomer, the relative viscosity of which was 2.01.

Then 50 g of this elastomer was kneaded together with 5 g of N-ethyltoluenesulfonamide, 0.08 g of 2,6-di-t-butyl-p-cresol, 1.5 g of 2,2'-dimethoxyphenylacetophenone, 5 g of M-600A, 5 g of lauryl methacrylate, 5 g of NK-ESTER 9G, and 5 g of diethylene glycol dimethacrylate at 150° C under a nitrogen atmosphere by using a kneader, yielding a uniform, transparent composition.

A 500-μm thick layer of this transparent photosensitive resin composition was laminated on a 100-μm thick polyester film using an adhesive to form a printing plate precursor, which was then subjected successively to light exposure, development, drying, and post-exposure according to the procedure of Example 4, forming a letterpress plate.

Upon printing by using this letterpress plate and a rotary letterpress machine, sharp images were obtained without substantial fattening of the image enlargement; the ink transfer and ink-coverage were good, and the letterpress plate exhibited high printing durability and excellent resolution.

What is claimed is:

1. A photosensitive resin composition comprising
(i) a thermoplastic elastomer selected from the group consisting of
A. a poly(amide-imide) ester formed from
   (a) a polyamide-forming monomer,
   (b) at least one compound capable of forming one or more imide rings which is selected from the group consisting of aromatic tricarboxylic acids, anhydrides thereof, aromatic tetracarboxylic acids, and anhydride thereof, and
   (c) at least one member selected from the group consisting of polyoxyalkylene glycols having number average molecular weights of 400 to 4000 and α-ω-dihydroxyhydrocarbons having number average molecular weights of 400 to 4000;
B. a poly(amide-imide) urethane formed from
   (d) a poly(amide-imide) ester defined in (A), alone or a mixture thereof with a polymer diol, and
   (e) a diisocyanate compound; and
C. a poly(amide-imide) urethane formed from
   (g) a mixture of a poly(amide-imide) ester formed from (f) an alkylene glycol of 2 to 4 carbon atoms, or a polyoxyalkylene glycol having a less number average molecular weight than 400 and the above (a) and (b), with a polymer diol, and
   (e) a diisocyanate compound,
(ii) an ethylenic unsaturated compound and
(iii) a photo polymerization initiator.

2. The photosensitive resin composition of claim 1, wherein the polymer diol is (i) a polyoxyalkylene glycol having a number average molecular weight of 400 to 4000, (ii) an α-ω-dihydroxyhydrocarbon having a number average molecular weight of 400 to 4000, (iii) a polyester diol constituted of both a polyoxyalkylene glycol having a number average molecular weight of 400 to 4000 and an α,ω-dicarboxyhydrocarbon having a number average molecular weight of 400 to 4000 in a former-to-latter molar ratio of from 1.2 to 2, or (iv) a mixture of two or all of the above (i), (ii), and (iii).

3. The photosensitive resin composition of claim 1, wherein the polyamide-forming monomer (a) is diaminoalkylpiperazine-adipic acid, diaminoalkylpiperazine-dodecane dicarboxylic acid, or hexamethylenediamine-sulfoisophthalic acid.

4. The photosensitive resin composition of claim 3, wherein the polyoxyalkylene glycol is a polyethylene glycol.

5. A photosensitive resin printing plate having a photosensitive resin layer of 0.1 to 10 mm thickness comprising a photosensitive resin composition as set forth in any one of claims 1 to 4.

* * * * *